United States Patent
Pedron, Jr.

(10) Patent No.: US 6,818,980 B1
(45) Date of Patent: Nov. 16, 2004

(54) STACKED SEMICONDUCTOR PACKAGE AND METHOD OF MANUFACTURING THE SAME

(75) Inventor: Serafin P. Pedron, Jr., Manteca, CA (US)

(73) Assignee: ASAT Ltd., New Territories (HK)

( * ) Notice: Subject to any disclaimer, the term of this patent is extended or adjusted under 35 U.S.C. 154(b) by 0 days.

(21) Appl. No.: 10/430,331

(22) Filed: May 7, 2003

(51) Int. Cl.$^7$ ............................................. H01L 23/48
(52) U.S. Cl. ..................... 257/706; 257/787; 257/777; 257/723
(58) Field of Search ................................ 257/706, 777, 257/723, 787

(56) References Cited

U.S. PATENT DOCUMENTS

| | | | | |
|---|---|---|---|---|
| 5,883,430 A | * | 3/1999 | Johnson ........................ | 257/706 |
| 6,472,736 B1 | * | 10/2002 | Yeh et al. ...................... | 257/686 |
| 2002/0089050 A1 | * | 7/2002 | Michii et al. ................ | 257/686 |
| 2002/0090753 A1 | * | 7/2002 | Pai et al. ...................... | 438/108 |
| 2002/0105067 A1 | * | 8/2002 | Oka et al. .................... | 257/686 |
| 2002/0144840 A1 | * | 10/2002 | Tzu et al. .................... | 174/260 |
| 2003/0197284 A1 | * | 10/2003 | Khiang et al. ............... | 257/777 |

* cited by examiner

*Primary Examiner*—Jasmine Clark
(74) *Attorney, Agent, or Firm*—Keating & Bennett LLP

(57) ABSTRACT

An integrated circuit package includes a substrate having conductive traces therein. A first semiconductor die is mounted in a die-down configuration to a first surface of the substrate. A second semiconductor die is mounted to a backside of the first semiconductor die. A plurality of connectors electrically connect the first semiconductor die to portions of the conductive traces of the substrate and a plurality of wire bonds connect the second semiconductor die to other portions of the conductive traces of the substrate. An encapsulant encapsulates the wire bonds and covers at least a portion of the first surface of the substrate and the second semiconductor die. A ball grid array is disposed on a second surface of the substrate, bumps of the ball grid array being connected with the conductive traces.

14 Claims, 8 Drawing Sheets

STACKED SEMICONDUCTOR PACKAGE AND METHOD OF MANUFACTURING THE SAME

FIELD OF THE INVENTION

The present invention relates in general to integrated circuit packaging, and more particularly to a stacked semiconductor die ball grid array package.

BACKGROUND OF THE INVENTION

High performance integrated circuit (IC) packages are well known in the art. Improvements in IC packages are driven by industry demands for increased thermal and electrical performance and decreased size and cost of manufacture.

Dynamic random access memory (DRAM) chips are commonly used in conjunction with flash memory chips in, for example, cellular phones, personal digital assistants (PDAs) and digital cameras. In particular, the DRAM chip is packaged in a single semiconductor package and mounted to a printed circuit board for use in a suitable application. Similarly, the flash memory chip is packaged in a single semiconductor package and is then mounted to the printed circuit board, adjacent the DRAM chip. The printed circuit board provides electrical connections for the two chips when assembled. Clearly, these two packages suffer from many disadvantages, including excessive space required for mounting two separate packages. Also, it is desirable to decrease printed circuit board assembly time and cost.

In one particular improvement to the above-described prior art, DRAM chips and flash memory chips have been encapsulated in a single package, in side-by-side relation to each other. Thus, a single, larger package is mounted to the printed circuit board on assembly. While this package provides the advantage of mounting only a single package containing both the DRAM and flash memory chips adjacent to each other, the package footprint is very large. It is desirable to reduce the package footprint and thereby reduce the area of the package on the printed circuit board.

It is therefore an object of an aspect of the present invention to provide an integrated circuit package and method of manufacturing the package that obviates or mitigates at least some of the disadvantages of the prior art.

SUMMARY OF THE INVENTION

In one aspect of the present invention, there is provided an integrated circuit package including a substrate having conductive traces therein. A first semiconductor die is mounted in a die-down configuration to a first surface of the substrate. A second semiconductor die is mounted to a backside of the first semiconductor die. A plurality of connectors electrically connect the first semiconductor die to portions of the conductive traces of the substrate and a plurality of wire bonds connect the second semiconductor die to other portions of the conductive traces of the substrate. An encapsulant encapsulates the wire bonds and covers at least a portion of the first surface of the substrate and the second semiconductor die. A ball grid array is disposed on a second surface of the substrate, bumps of the ball grid array being connected with the conductive traces.

In another aspect, there is provided a process for fabricating an integrated circuit package. The process includes: mounting a first semiconductor die in a die-down configuration, over a cavity in a substrate, the substrate including conductive traces therein; mounting a second semiconductor die to a backside of the first semiconductor die; wire boding the second semiconductor die to portions of the conductive traces of the substrate; encapsulating the wire bonds between the second semiconductor die and the conductive traces of the substrate, in an encapsulant; wire bonding the first semiconductor die to other portions of the conductive traces of the substrate; encapsulating the wire bonds between the first semiconductor die and the substrate; and forming a ball grid array on a second side of the substrate, bumps of the ball grid array being electrically connected to ones of the conductive traces.

In one aspect, the first semiconductor die is a dynamic random access memory (DRAM) chip and the second semiconductor die is a flash memory chip. Advantageously, the second semiconductor die is stacked on the first semiconductor die, thereby providing a package including both semiconductor dice and having a smaller footprint than the conventional packages. Thus, the package requires less area when mounted on the motherboard, thereby aiding in reducing the size of the motherboard.

BRIEF DESCRIPTION OF THE DRAWINGS

The invention will be better understood with reference to the drawings and the following description, in which.

DETAILED DESCRIPTION OF THE PREFERRED EMBODIMENTS

Figure 1:
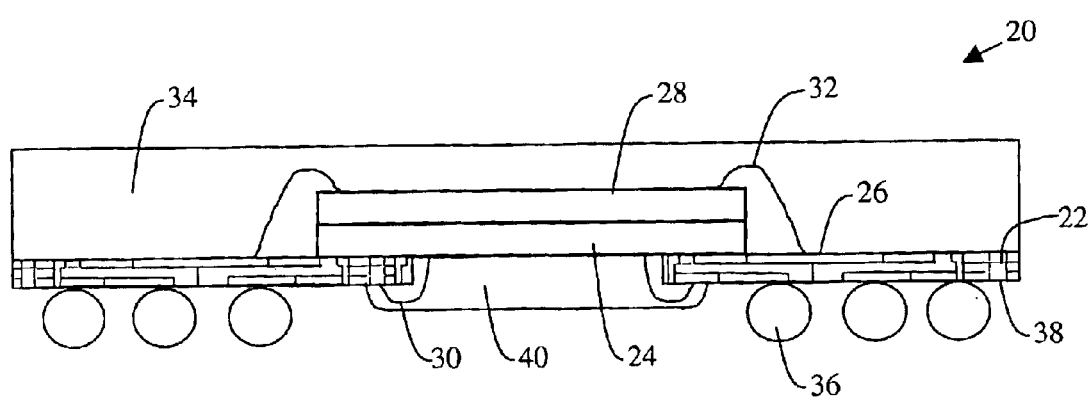
FIG. 1 is a sectional side view of an integrated circuit package according to an embodiment of the present invention.

Reference is first made to FIG. 1, which shows a sectional side view of an integrated circuit package indicated generally by the numeral 20. The integrated circuit package 20 includes a substrate 22 with conductive traces therein. A first semiconductor die 24 is mounted in a die-down configuration to a first surface 26 of the substrate 22. A second semiconductor die 28 is mounted to a backside of the first semiconductor die 24. A plurality of connectors 30 electrically connect the first semiconductor die 24 to portions of the conductive traces of the substrate 22 and a plurality of wire bonds 32 connect the second semiconductor die 28 to other portions of the conductive traces of the substrate 22. An encapsulant 34 encapsulates the wire bonds 32 and covers at least a portion of the first surface of the substrate 22 and the second semiconductor die 24. A ball grid array of solder balls 36 is disposed on a second surface 38 of the substrate 22, solder balls 36, also referred to as bumps, of the ball grid array being connected with the conductive traces of the substrate 22.

Figure 2A:
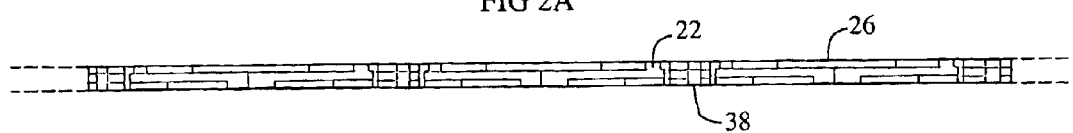
FIGS. 2A to 2J show processing steps for fabricating the integrated circuit package of FIG. 1.

The integrated circuit package 20 will now be described in more detail with reference to FIGS. 2A to 2I to describe processing steps for fabricating the integrated circuit package 20, in accordance with an embodiment of the present invention. Referring first to FIG. 2A, the substrate 22 of a bismaleimidetriazine (BT) resin/glass epoxy printed circuit board is shown. The substrate 22 includes conductive metal or alloy traces that provide conductive paths for signal transfer. The conductive traces are patterned during manufacture of the substrate 22. The substrate manufacturing and the patterning of the conductive traces are well known and well understood by those skilled in the art. The substrate 22 is in the form of a strip for producing a number of BGA units. Only one such unit is depicted in FIG. 2A, portions of adjacent units being shown by stippled lines. The present discussion describes the fabrication of a single integrated circuit package 20 for the purpose of simplicity only and it will be understood that the package 20 is preferably gang fabricated.

Figure 2B:
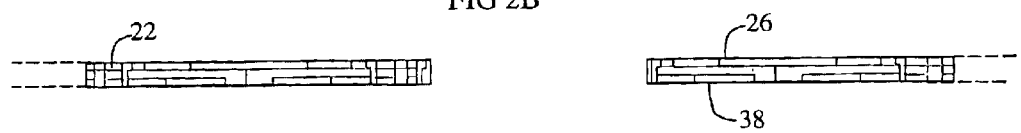

Referring to FIG. 2B, a cavity is created in the substrate 22 by, for example, mechanical punching. Other suitable methods of creating a cavity in the substrate 22, are possible.

Figure 2C:
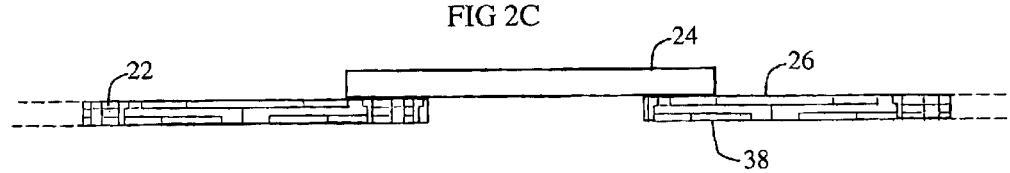

After creation of the cavity in the substrate 22, the first semiconductor die 24, a dynamic random access memory (DRAM) chip, is fixed to the substrate 22 such that the first semiconductor die 24 spans the cavity, as shown in FIG. 2C. The first semiconductor die 24 is fixed to the substrate 22 using a suitable adhesive, such as a die attach epoxy, followed by epoxy curing. As previously stated, the first semiconductor die 24 is fixed to the substrate 22 in a die-down configuration. In other words, the semiconductor die 24 is fixed to the substrate 22 such that the conductive pad array of the semiconductor die 24 faces into the cavity of the substrate 22. Care is taken to inhibit the flow of adhesive onto the pads of the conductive pad array during attachment of the semiconductor die 24.

Figure 2D:
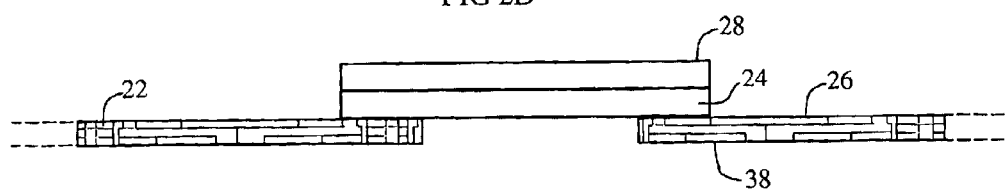

Next, the second semiconductor die 28, a flash memory chip, is fixed to the backside of the first semiconductor die 24, as shown in FIG. 2D. The second semiconductor die 28 is fixed to the first semiconductor die 24, using a suitable adhesive, such as a die attach epoxy, followed by epoxy curing. The second semiconductor die 28 is fixed to the first semiconductor die 24 in a die-up configuration, such that the conductive pad array of the second semiconductor die 28 is on the opposite side of conductive pad array of the first semiconductor die 24. Clearly the conductive pad array of the second semiconductor die 28 faces the opposite direction as the conductive pad array of the first semiconductor die 24.

Figure 2E:
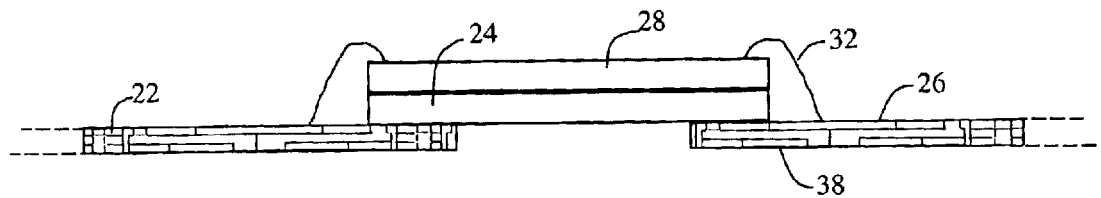

Wire bonds 32 are then bonded between the conductive pads of the array of the second semiconductor die 28 and portions of some of the conductive traces on the first surface 26 of the substrate 22 (FIG. 2E).

Figure 2F:
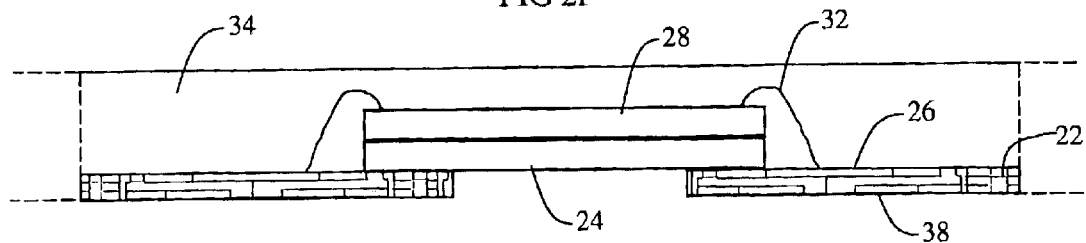

After wire bonding, the wire bonds 32 are encapsulated in an overmold compound, referred to herein above as the encapsulant 34. As shown in FIG. 2F, the overmold compound 34 encapsulates an upper portion of the package 20, including the first surface 26 of the substrate 22, the wire bonds and the second semiconductor die 28. Thus, the wire bonds 32 as well as the first surface 26 of the substrate 22 and the second semiconductor die 28 are protected.

Figure 2G:
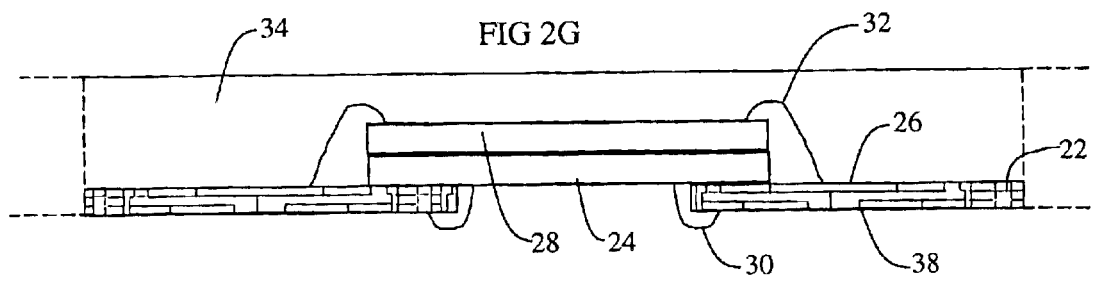

Next, wire bonds, also referred to herein above as connectors 30 are bonded between the conductive pads of the array of the first semiconductor die 24 and portions of some of the conductive traces on the second surface 38 of the substrate 22 (FIG. 2G).

Figure 2H:
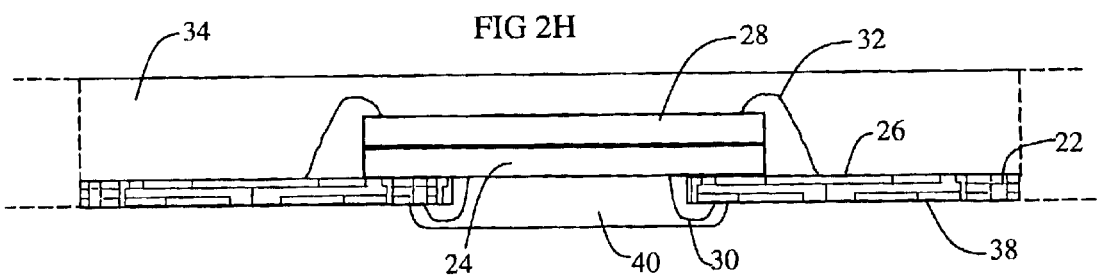

After wire bonding, the wire bond connectors 30 are encapsulated in a potting material 40. As will be understood by those skilled in the art, a potting material is a liquid encapsulant, usually epoxy-based, and is typically applied by syringe and needle dispensing. As shown in FIG. 2H, the potting material 40 fills the cavity in the substrate 22 and covers the wire bond connectors 30, the exposed portion of the first semiconductor die 24, and a portion of the second surface 38 of the substrate 22. Clearly, the potting material 40 provides protection for the wire bond connectors 30, the first semiconductor die 24, and the portion of the second surface 38 of the substrate 22.

Figure 2I:
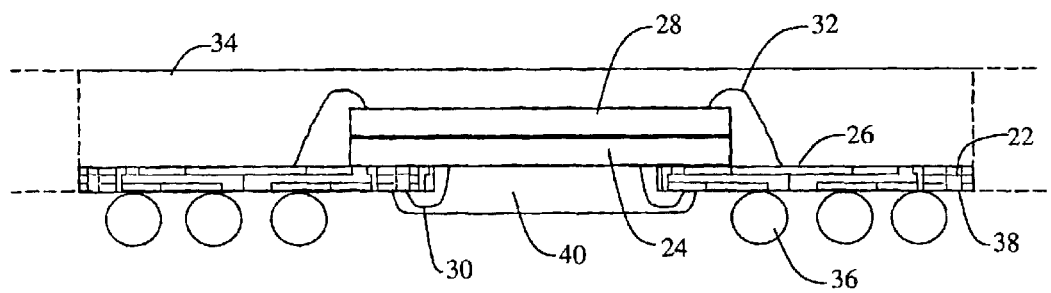

The ball grid array in the form of solder balls 36, also referred to as solder bumps, is formed on the second surface 38 of the substrate 22 by conventional positioning (FIG. 2I). To attach the solder balls 36, a flux is added to the solder balls 36 prior to placement and, after placement, the solder balls 36 are reflowed using known reflow techniques. The solder balls are thereby connected to the conductive traces of the substrate 22 and through the connectors 30 and the wire bonds 32, to the first and second semiconductor dice 24, 28, respectively. The solder balls 36 provide signal and power connections as well as ground connections for the semiconductor dice 24, 28.

Figure 2J:
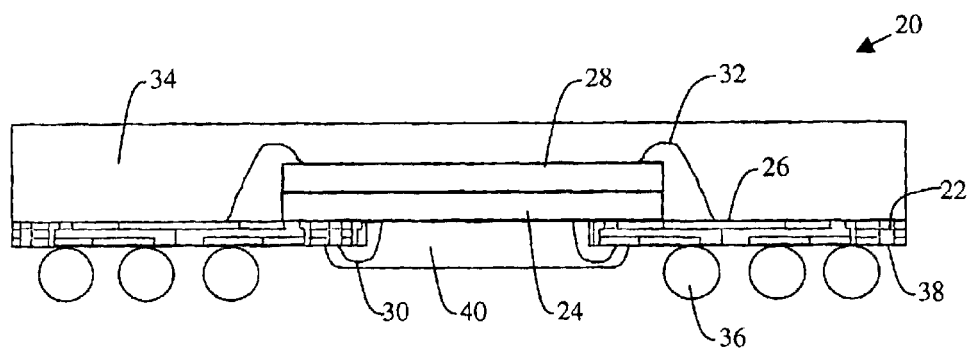

Singulation of the individual ball grid array (BGA) units from the strip is then performed either by saw singulation or die punching, resulting in the configuration shown in FIG. 2J. Thus, the individual package 20 is isolated from other packages.

Figure 3:
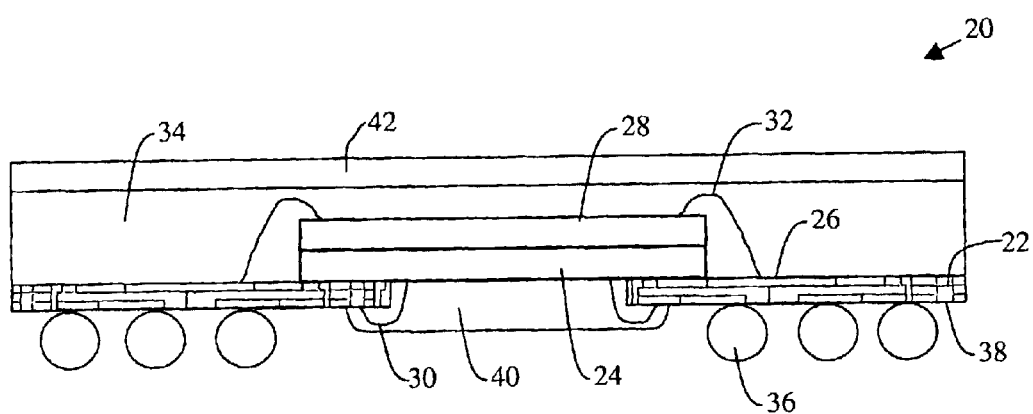
FIG. 3 is a sectional side view of an integrated circuit package according to another embodiment of the present invention.

Reference is now made to FIG. 3 to describe an integrated circuit package 20 according to an alternative embodiment of the present invention. In this embodiment a heat sink 42 is included in the package 20 for conducting heat away from the second semiconductor die. The heat sink 42 is molded into the package during encapsulation in the overmold compound 34. As will be understood by those skilled in the art, the heat sink 42 is molded into the package by loading the heat sink 42 into the mold in strip format and aligning using appropriate locating pins in the mold tooling.

Figure 4A:
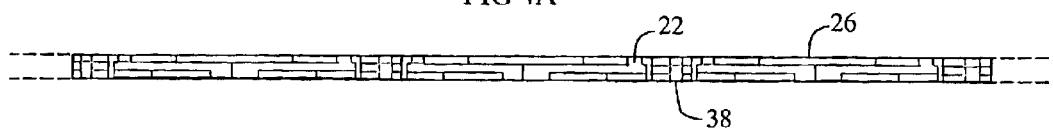
FIGS. 4A to 4K show processing steps for fabricating an integrated circuit package according to another embodiment of the present invention.
Figure 4B:
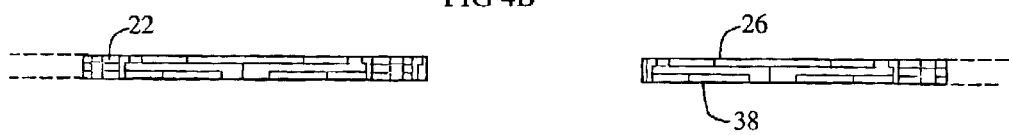
Figure 4C:
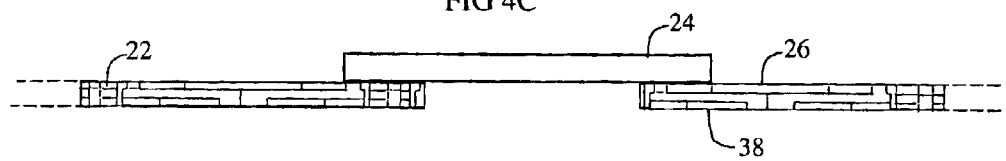
Figure 4D:
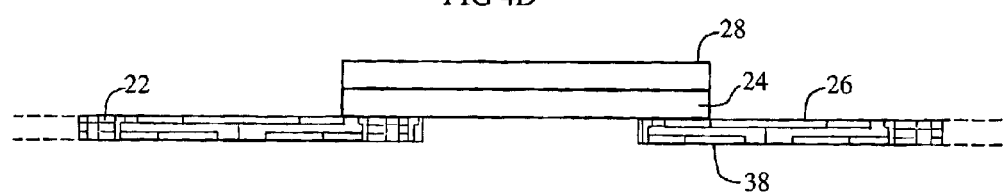
Figure 4E:
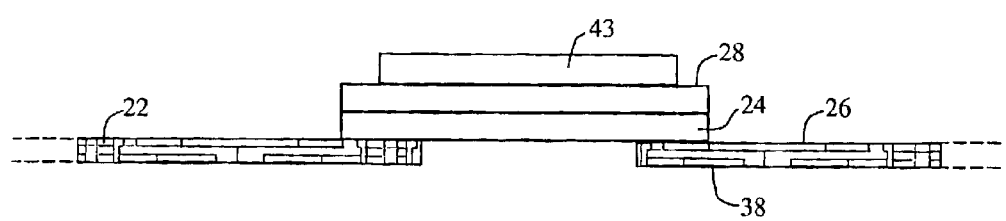
Figure 4F:
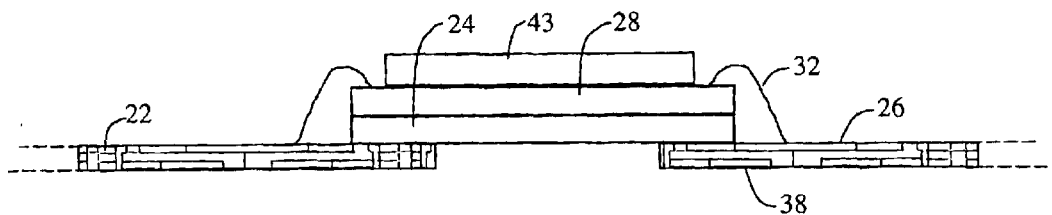
Figure 4G:
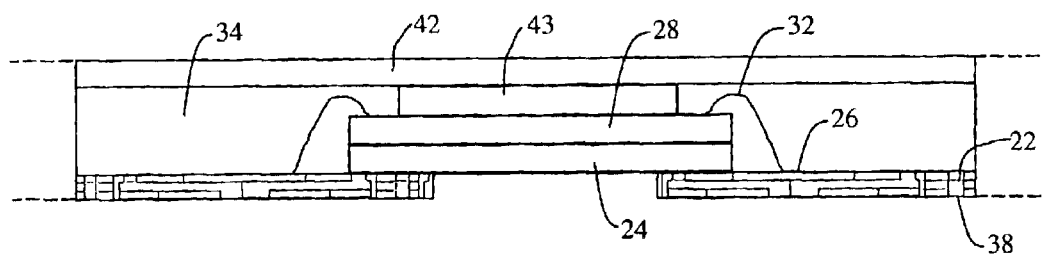
Figure 4H:
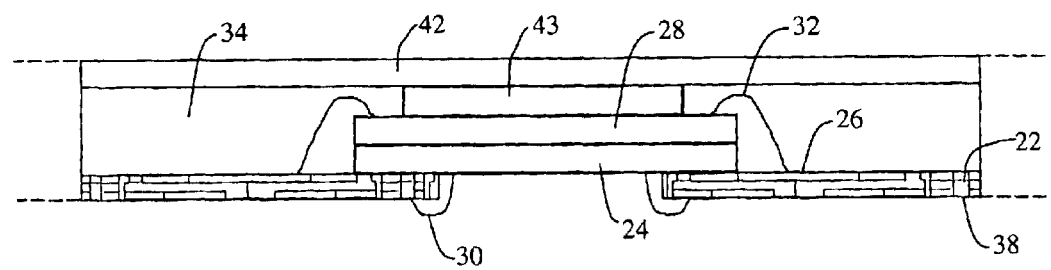
Figure 4I:
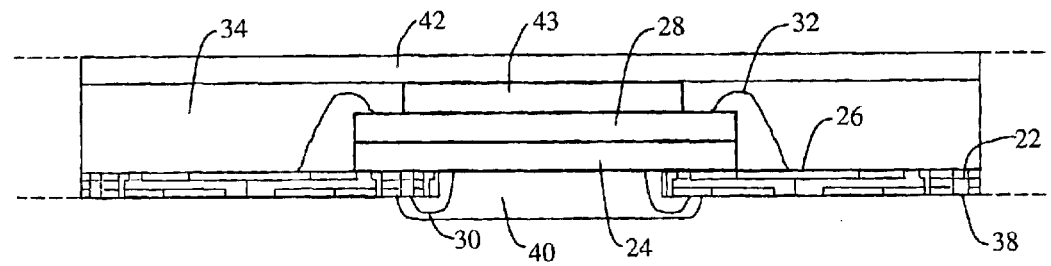
Figure 4J:
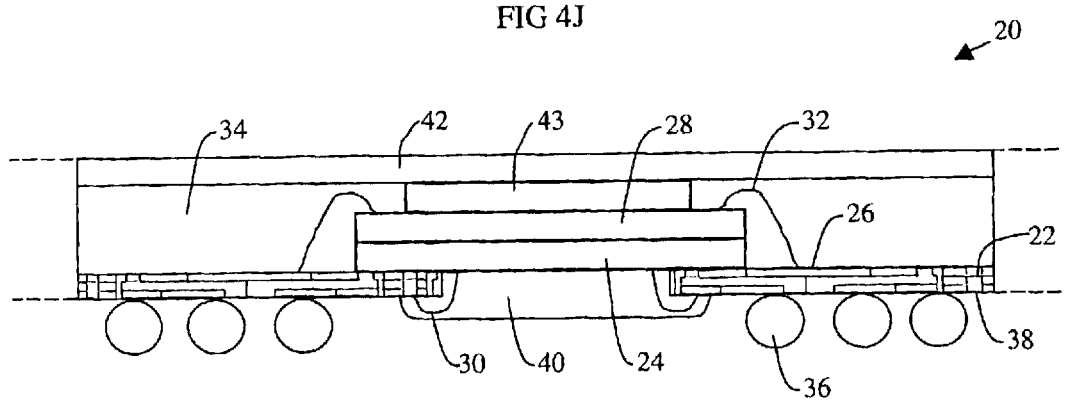
Figure 4K:
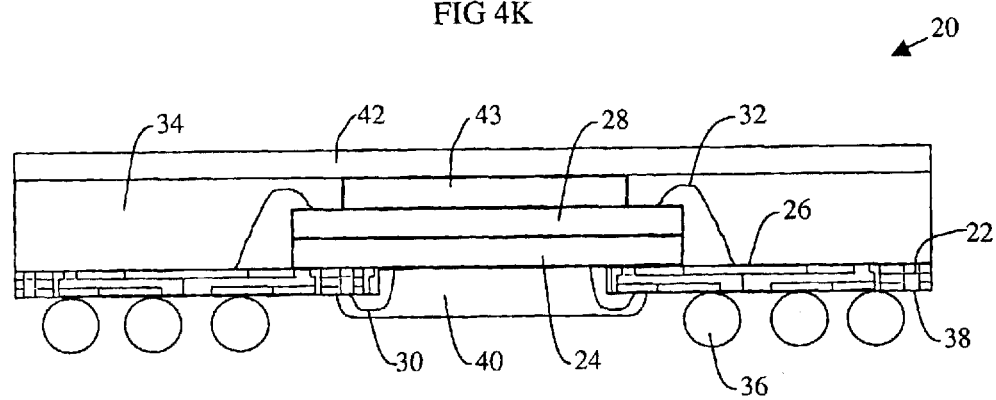

Reference is now made to FIGS. 4A to 4K to describe a process for manufacturing an integrated circuit package 20 in which a dummy silicon chip 43 is attached to the second semiconductor die 28 prior to encapsulation, in accordance with still another embodiment of the present invention. FIGS. 4A to 4D are similar to FIGS. 2A to 2D and therefore need not be further described herein. The dummy silicon chip 43 is attached to the second semiconductor die using a thermally conductive, electrically insulative epoxy (FIG. 4E). Next, the wire bonds 32 are bonded between the conductive pads of the array of the second semiconductor die 28 and the portions of some of the conductive traces on the first surface 26 of the substrate 22 (FIG. 4F). After wire bonding, the heat sink 42 is molded into the package during encapsulation in the overmold compound 34 such that the heat sink 42 is in contact with the dummy silicon chip 43 (FIG. 4G). FIGS. 4H to 4K are similar to FIGS. 2G to 2J, respectively, and therefore need not be further described herein.

The dummy silicon chip 43 has high thermal conductivity and similar thermo-mechanical properties to the semiconductor die. As shown, the dummy silicon chip 43 is in contact with both the second semiconductor chip 28 and the heat sink 42. A conductive thermal path is thereby provided from the second semiconductor die 28, through the dummy silicon chip 43 and to the heat sink 42.

A specific embodiment of the present invention has been shown and described herein. However, variations and modifications to these embodiments may occur to those skilled in the art. For example, the substrate is not limited to the BT/resin glass epoxy printed circuit board as other suitable laminate substrate materials can be employed. Other variations and modifications may occur to those skilled in the art. All such modifications and variations are believed to be within the sphere and scope of the present invention.

What is claimed is:

1. An integrated circuit package comprising:
   a substrate having conductive traces therein, the substrate including a cavity therein;
   a first semiconductor die mounted in a die-down configuration to a first surface of said substrate such that said first semiconductor die spans said cavity;
   a second semiconductor die mounted to a backside of said first semiconductor die;
   a first plurality of wire bonds electrically connecting said first semiconductor die to portions of said conductive traces of said substrate;
   a second plurality of wire bonds connecting said second semiconductor die to other portions of said conductive traces of said substrate;
   an encapsulant encapsulating said second plurality of wire bonds and covering at least a portion of said first surface of said substrate and said second semiconductor die;
   a ball grid array disposed on a second surface of said substrate, bumps of said ball grid array being connected with said conductive traces;
   a second encapsulant, encapsulating said first plurality of wire bonds; and
   a dummy silicon die disposed on said second semiconductor die.

2. The integrated circuit package according to claim 1, wherein the second plurality of wire bonds connect said second semiconductor die to said other portions of said conductive traces, said other portions being disposed on said first side of said substrate.

3. The integrated circuit package according to claim 1, wherein the first plurality of wire bonds connect said first semiconductor die to portions of said conductive traces, said portions of said conductive traces being disposed on a second side of said substrate.

4. The integrated circuit package according to claim 1, further comprising a heat sink, disposed in said encapsulating material for conducting heat away from said second semiconductor die.

5. The integrated circuit package according to claim 1, further comprising a heat sink disposed in said encapsulating material and in contact with said dummy silicon die for conducting heat away from said second semiconductor die.

6. The integrated circuit package according to claim 5, wherein said heat sink is disposed on a portion of said second semiconductor die.

7. An integrated circuit package comprising:
   a substrate having conductive traces therein;
   a first semiconductor die mounted in a die-down configuration to a first surface of said substrate;
   a second semiconductor die mounted to a backside of said first semiconductor die;
   a plurality of connectors electrically connecting said first semiconductor die to portions of said conductive traces of said substrate;
   a plurality of wire bonds connecting said second semiconductor die to other portions of said conductive traces of said substrate;
   an encapsulant encapsulating said wire bonds and covering at least a portion of said first surface of said substrate and said second semiconductor die; and
   a ball grid array disposed on a second surface of said substrate, bumps of said ball grid array being connected with said conductive traces,
   wherein said first semiconductor die is a dynamic random access memory chip and said second semiconductor die is a flash memory chip.

8. A process for fabricating an integrated circuit package, comprising:
   mounting a first semiconductor die in a die-down configuration, over a cavity in a substrate, the substrate including conductive traces therein;
   mounting a second semiconductor die to a backside of said first semiconductor die;
   wire bonding said second semiconductor die to portions of said conductive traces of said substrate;
   encapsulating the wire bonds between the second semiconductor die and said conductive traces of said substrate, in an encapsulant;
   wire bonding said first semiconductor die to other portions of said conductive traces of said substrate;
   encapsulating the wire bonds between the first semiconductor die and said substrate; and
   forming a ball and array on a second side of the substrate, bumps of the ball grid array being electrically connected to ones of said conductive traces, wherein said mounting a first semiconductor die comprises mounting a dynamic random access memory chip in a die-down configuration, over said cavity in said substrate.

9. The process for fabricating an integrated circuit package according to claim 8, wherein said mounting a second semiconductor die comprises mounted a flash memory chip to a backside of said dynamic random access memory chip.

10. The process for fabricating an integrated circuit package according to claim 9, wherein said wire bonding said second semiconductor die to portions of said conductive traces of said substrate includes wire bonding the second semiconductor die to said conductive traces on a first side of said substrate.

11. The process for fabricating an integrated circuit package according to claim 10, wherein said wire bonding said first semiconductor die to other portions of said conductive traces of said substrate includes wire bonding the first semiconductor die to ones of said conductive traces on the second side of the substrate.

12. A process for fabricating an integrated circuit package, comprising.
   mounting a first semiconductor die in a die-down configuration, over a cavity in a substrate, the substrate including conductive traces therein;
   mounting a second semiconductor die to a backside of said first semiconductor die;
   wire bonding said second semiconductor die to portions of said conductive traces of said substrate;
   fixing a dummy silicon die on said second semiconductor die, prior to encapsulating the wire bonds between the second semiconductor die and said conductive traces of said substrate in an encapsulant;
   encapsulating the wire bonds between the second semiconductor die and said conductive traces of said substrate, in the encapsulant;
   wire bonding said first semiconductor die to other portions of said conductive traces of said substrate;
   encapsulating the wire bonds between the first semiconductor die and said substrate; and
   forming a ball arid array on a second side of the substrate, bumps of the ball grid array being electrically connected to ones of said conductive traces.

13. A process for fabricating an integrated circuit package, comprising;

mounting a first semiconductor die in a die-down configuration, over a cavity in a substrate, the substrate including conductive traces therein;

mounting a second semiconductor die to a backside of said first semiconductor die;

fixing a dummy silicon die on said second semiconductor die, prior to wire bonding said second semiconductor die to portions of said conductive traces of said substrate, for conducting heat away from said second semiconductor die;

wire bonding said second semiconductor die to portions of said conductive traces of said substrate;

encapsulating the wire bonds between the second semiconductor die and said conductive traces of said substrate, in an encapsulant;

wire bonding said first semiconductor die to other portions of said conductive traces of said substrate;

encapsulating the wire bonds between the first semiconductor die and said substrate; and forming a ball grid array on a second side of the substrate, bumps of the ball grid array being electrically connected to ones of said conductive traces.

14. The process for fabricating an integrated circuit package according to claim 13, wherein encapsulating the wire bonds between the second semiconductor die and said conductive traces of said substrate includes molding a heat sink in contact with said dummy silicon die for conducting heat away from said dummy silicon die.

* * * * *